US008336488B2

(12) United States Patent
Chen et al.

(10) Patent No.: US 8,336,488 B2
(45) Date of Patent: Dec. 25, 2012

(54) MULTI-STATION PLASMA REACTOR WITH MULTIPLE PLASMA REGIONS

(75) Inventors: Aihua Chen, Shanghai (CN); Yijun Liu, Shanghai (CN); Jinyuan Chen, Shanghai (CH); Lee Luo, Shanghai (CN); Tuqiang Ni, Shanghai (CN); Gerald Yin, Shanghai (CN); Henry Ho, Shanghai (CN)

(73) Assignee: Advanced Micro-Fabrication Equipment, Inc. Asia, Georgetown, Grand Cayman (KY)

( * ) Notice: Subject to any disclaimer, the term of this patent is extended or adjusted under 35 U.S.C. 154(b) by 1265 days.

(21) Appl. No.: 11/961,718

(22) Filed: Dec. 20, 2007

(65) Prior Publication Data

US 2009/0139453 A1    Jun. 4, 2009

(30) Foreign Application Priority Data

Nov. 30, 2007    (CN) .......................... 2007 1 0171405

(51) Int. Cl.
*C23C 16/505* (2006.01)

(52) U.S. Cl. .......... 118/723 R; 156/345.55; 156/345.47; 118/730; 118/723 I

(58) Field of Classification Search ............... 118/723 I, 118/730, 723 R; 156/345.55, 345.47
See application file for complete search history.

(56) References Cited

U.S. PATENT DOCUMENTS

| 4,123,316 A | 10/1978 | Tsuchimoto |
| 4,138,306 A | 2/1979 | Niwa |
| 4,232,057 A | 11/1980 | Ray et al. |
| 5,648,175 A | 7/1997 | Russell et al. |
| 6,124,003 A | 9/2000 | Mikami et al. |
| 6,192,828 B1 | 2/2001 | Takahashi et al. |
| 6,245,396 B1 | 6/2001 | Nogami |
| 6,427,623 B2 | 8/2002 | Ko |
| 6,499,425 B1 * | 12/2002 | Sandhu et al. ............ 118/723 E |
| 6,576,062 B2 * | 6/2003 | Matsuse ........................ 118/719 |
| 6,886,491 B2 | 5/2005 | Kim et al. |
| 6,892,669 B2 | 5/2005 | Xu et al. |
| 6,932,871 B2 * | 8/2005 | Chang et al. .................. 118/719 |
| 2007/0031236 A1 * | 2/2007 | Chen .............................. 414/936 |
| 2007/0032097 A1 * | 2/2007 | Chen et al. .................... 438/795 |
| 2007/0218623 A1 * | 9/2007 | Chua et al. .................... 438/240 |

FOREIGN PATENT DOCUMENTS

| DE | 19914132559 A1 | 4/1993 |
| JP | 53-91164 | 8/1978 |
| JP | 53-91663 | 8/1978 |
| JP | 53-91665 | 8/1978 |
| JP | 53-91667 | 8/1978 |
| JP | 6260434 | 9/1994 |
| JP | 11-12742 A | 1/1999 |

OTHER PUBLICATIONS

Machine Generated English Translation of JP 6260434 to Nissin Electric Co. Ltd. Published Sep. 16, 1994.*

* cited by examiner

*Primary Examiner* — Sylvia R. MacArthur
(74) *Attorney, Agent, or Firm* — Nixon Peabody LLP; Joseph Bach, Esq.

(57) ABSTRACT

A plasma chamber is constructed to have a chamber body defining therein a plurality of process stations. A plurality of rotating substrate holders are each situated in one of the process stations and a plurality of in-situ plasma generation regions are each provided above one of the substrate holders. A plurality of quasi-remote plasma generation regions are each provided above a corresponding in-situ plasma generation region and being in gaseous communication with the corresponding in-situ plasma generation region. An RF energy source is coupled to each of the quasi-remote plasma generation regions.

28 Claims, 12 Drawing Sheets

MULTI-STATION PLASMA REACTOR WITH MULTIPLE PLASMA REGIONS

BACKGROUND

1. Field of the Invention

The general field of the invention relates to plasma chambers and, more specifically, plasma chambers used in the fabrication of microchips, LCD panels, solar cells, etc.

2. Related Arts

Various plasma chambers have been used in the art for fabrication of semiconductor wafers, substrates for LCD panels, solar cells, etc. In this context, it is possible to divide such chambers into three categories depending on where the plasma is generated. In situ plasma chambers are those where the plasma is generated immidiately above the substrate that is being procceed and where the plasma can directly contact the substrate. Example of such a chamber is provided in the prior art section of U.S. Pat. No. 4,123,316. Such arraneggements are usually implemented when the plasma is used for the processing of the substrate. Remote plasma chambers are those where the plasma is generated remotely from the chamber, but a conduit is provided to transfer the plasma species onto the chamber where the substrate is processed. Example of such an arrangement is provided in, e.g., German patent application DE 19914132559, published in 1993 and U.S. Pat. No. 4,138,306. Such arrangements are usually implemented when the plasma species are used to clean the chamber where the substrate is processed, but may also be used for substrate processing. A third category is quasi-remote plasma chambers, where the plasma is generated in the same chamber where the substrate is processed, however a divider is provided between the section where the plasma is generated and the area where the wafer resides. In this manner, species from the plasma may drift towards the substrate, but the plasma cannot contact the substrate. Examples of such an arrangement are shown in U.S. Pat. Nos. 4,123,316 and 6,192,828. Quasi-remote plasma may also be implemented without having the divider, by simply having a plasma generation source that is positioned remotely from the substrate location. An example is provided in U.S. Pat. No. 4,232,057.

Remote plasma-assisted chemical vapor deposition is one application of remote plasma chamber technology. It can generally be used to deposit thin films at lower temperature and can provide high film quality, such as stoichiometric film, and excellent conformity by controlling the gas phase reaction pathway and creating desired gas species through selective gas plasma excitation. Since the substrate is placed remotely from the plasma glow region, plasma damage on the substrate is avoided. However, gas dissociation reaction is decreased due to minimal ion bombardment and the decay of radicals, which leads to a lower deposition rate. Quasi Remote Plasma CVD may be used to enhance deposition rate while maintaining the above advantages by increasing radical density by, e.g., shortening the path from the plasma to the wafer to avoid decay of radicals.

On the other hand, direct plasma is sometimes necessary for film formation, for example, when specific film properties such as high compressive stresses are required. Such film properties may be achieved by in situ plasma, due to its strong ion bombardment effect. Also, in order to efficiently perform a plasma treatment on substrate or deposited film surface for improving interface adhesion and film stability for device reliability in most of Cu interconnection processes, direct plasma is needed because of high radical and ion density. Furthermore, in-situ plasma is more effective than remote plasma for high carbon containing materials CVD reactor clean.

As can be understood from the above, conflicting process requirements necessitate seemingly incompatible chamber designs. While some processes require the plasma to be generated remotely from the substrate, others require the plasma to be generated so as to contact the substrate. Therefore, what is needed is a reactor comprising both remote or quasi-remote and direct plasma capability. Such an arrangement may be useful not only for forming film with satisfactory film properties, but also for performing plasma treatment for device reliability and effective reactor cleaning. For further related information the reader is encouraged to review the following publications: U.S. Pat. No. 5,648,175, U.S. Pat. No. 6,124,003, U.S. Pat. No. 6,192,828, U.S. Pat. No. 6,245,396, U.S. Pat. No. 6,892,669, U.S. Pat. No. 6,427,623, U.S. Pat. No. 6,886,491, U.S. Pat. No. 6,499,425, JP 53-91664, JP 2601127, JP 11-12742, JP 53-91663, JP 53-91665, and JP 53-91667.

SUMMARY

The following summary of the invention is provided in order to provide a basic understanding of some aspects and features of the invention. This summary is not an extensive overview of the invention, and as such it is not intended to particularly identify key or critical elements of the invention, or to delineate the scope of the invention. Its sole purpose is to present some concepts of the invention in a simplified form as a prelude to the more detailed description that is presented below.

Embodiments of the invention provide chambers that enable utilizing both quasi-remote and in-situ plasma for substrate processing and chamber cleaning. Various embodiments also enable increased throughput by utilizing a mini-batch approach in which each chamber has a plurality of process zones or regions, enabling simultaneous processing of several substrates. However, it should be appreciated that certain features of the invention are not limited to implementation within the mini-batch chamber. Further embodiments of the invention provide an "all-in-one" CVD reactor which has both remote and direct plasma capability, and can be used for film formation by thermal CVD, quasi-remote plasma CVD, and plasma enhanced CVD, and also for in-situ plasma treatment for substrate, and film and plasma reactor cleaning. Due to these expanded capabilities, this reactor is referred to herein as an all-in-one (AIO) CVD reactor. The AIO reactor may be implemented as a single substrate chamber or have several process stations for mini-batch processing.

Aspects of the invention provide a plasma chamber, comprising: a chamber body defining therein a plurality of process stations; a plurality of rotating substrate holders, each situated in one of the process stations; a plurality of in-situ plasma generation regions, each plasma generation region provided above one of the substrate holders; a plurality of quasi-remote plasma generation regions, each provided above a corresponding in-situ plasma generation region and being in gaseous communication with the corresponding in-situ plasma generation region; and, an RF energy source coupled to each of the quasi-remote plasma generation regions. The plasma chamber may further comprise a first gas delivery system coupled to the each of the quasi-remote plasma generation regions, and a second gas delivery system coupled to the each of the in-situ plasma generation regions. The second gas delivery system may further deliver gaseous species from each of the quasi-remote plasma generation regions to a corresponding in-situ plasma generation region. The plasma chamber may further comprise evacuation manifold coupling all of the process stations to a single vacuum pump. The RF energy source may comprise a high frequency RF generator, a low frequency RF generator, and an RF match. The plasma chamber may further comprise a switching mechanism controlling plasma striking in the quasi-remote plasma generation regions and the in-situ plasma generation regions. The plasma chamber may further comprise a heater situated within each of the substrate holders.

Aspects of the invention also provide a plasma chamber, comprising: a chamber body; a rotating substrate holder situated within the chamber body; a first showerhead; a second showerhead spaced apart from the first showerhead and electrically insulted from the first showerhead and from the chamber body, wherein a quasi-remote plasma generation region is defined in between the first and second showerheads and an in-situ plasma generation region is defined between the second showerhead and the substrate holder, the first showerhead delivering first process gas to the quasi-remote plasma generation region and the second showerhead delivering second process gas to the in-situ plasma generation region, the second showerhead further delivering plasma species from the quasi-remote plasma generation region to the in-situ plasma generation region; an RF source coupled to the first showerhead; and, a switching mechanism alternatively coupling the second showerhead to the RF source or to ground potential. The switching mechanism may comprise an arrangement of movable mechanical contacts alternatively coupling the second showerhead to the first showerhead or to the chamber body. The switching mechanism may comprise an electrical switch. The second showerhead may comprise a conductive shower plate, an insulation plate coupled to the conductive shower plate, and a conductive block plate coupled to the insulation plate; and, wherein the block plate is coupled to ground and the switching mechanism alternatively couples the conductive shower plate to the RF source or to ground potential. The switching mechanism may further alternatively couple the first showerhead to the RF source or to floating potential. The second showerhead may comprise a shower plate and a conductive block plate coupled to the shower plate, and wherein the block plate comprises hemispherical holes facing the quasi-remote plasma generation region. The second showerhead may further comprise a buffer plate for even distribution of the second process gas. The plasma chamber may further comprise a heater situated in the substrate holder. The RF source may comprise a high frequency RF generator, a low frequency RF generator, and an RF match.

Aspects of the invention further provide a plasma chamber, comprising: a chamber body defining therein a plurality of process stations; a plurality of rotating substrate holders, each situated in one of the process stations; a plurality of upper showerheads, each upper showerhead provided in corresponding process station; a plurality of lower showerheads, each lower showerhead provided in a corresponding process region and spaced apart from the upper showerhead and electrically insulted from the upper showerhead and from the chamber body, wherein a quasi-remote plasma generation region is defined in between the upper and lower showerheads in each processing region, and an in-situ plasma generation region is defined between the lower showerhead and the substrate holder in each process region, the upper showerhead delivering first process gas to the quasi-remote plasma generation region and the lower showerhead delivering second process gas to the in-situ plasma generation region, the lower showerhead further delivering plasma species from the quasi-remote plasma generation region to the in-situ plasma generation region; an RF source coupled to the plurality of upper showerheads; and, a switching mechanism alternatively coupling the lower showerhead to the RF source or to ground potential. The plasma chamber may further comprise evacuation manifold coupling all of the process stations to a single vacuum pump. The RF energy source may comprise a high frequency RF generator, a low frequency RF generator, and an RF match. The switching mechanism may further control plasma striking in each of the quasi-remote plasma generation regions and each of the in-situ plasma generation regions. The switching mechanism may comprise an arrangement of movable mechanical contacts alternatively coupling each of the lower showerheads to the corresponding upper showerhead or to the chamber body. The switching mechanism may comprise an electrical switch. Each of the lower showerheads may comprise a conductive shower plate, an insulation plate coupled to the conductive shower plate, and a conductive block plate coupled to the insulation plate; and, wherein the block plate is coupled to ground and the switching mechanism alternatively couples the conductive shower plate to the upper showerhead or to ground potential. The switching mechanism may further alternatively couple the first showerhead to the RF source or to floating potential. Each of the lower showerheads may comprise a shower plate and a conductive block plate coupled to the shower plate, and wherein the block plate comprises hemispherical holes facing the quasi-remote plasma generation region. The switching mechanism may further alternatively couple the lower showerhead to float potential.

Aspects of the invention also provide a plasma chamber, comprising: a chamber body; a rotating substrate holder situated within the chamber body; a first showerhead; a second showerhead spaced apart from the first showerhead and electrically insulted from the first showerhead and from the chamber body, wherein a quasi-remote plasma generation region is defined in between the first and second showerheads and an in-situ plasma generation region is defined between the second showerhead and the substrate holder, the first showerhead delivering first process gas to the quasi-remote plasma generation region and the second showerhead delivering second process gas to the in-situ plasma generation region, the second showerhead further delivering plasma species from the quasi-remote plasma generation region to the in-situ plasma generation region; a first RF source selectively coupled to the first showerhead either by mechanical switching or software control; and, a second RF source selectively coupled to the second showerhead either by mechanical switching or software control.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

Various embodiments of the invention are generally directed to plasma chamber for processing substrates, such as semiconductor wafers, solar cell wafers, LCD substrates, etc. The various embodiments described herein may be used in connection with conventional automated processing platforms. The various embodiments described may be used, for example, for thermal chemical vapor deposition (CVD), plasma enhanced CVD, in-situ plasma treatment of substrates, etc. In the embodiments illustrated, each chamber has four processing stations simultaneously performing the same process; however, it should be appreciated that the chamber may have two, three, or other number of stations. However, the number of stations is kept low, so that such an arrangement is referred to herein as a "mini-batch" system.

Figure 1:
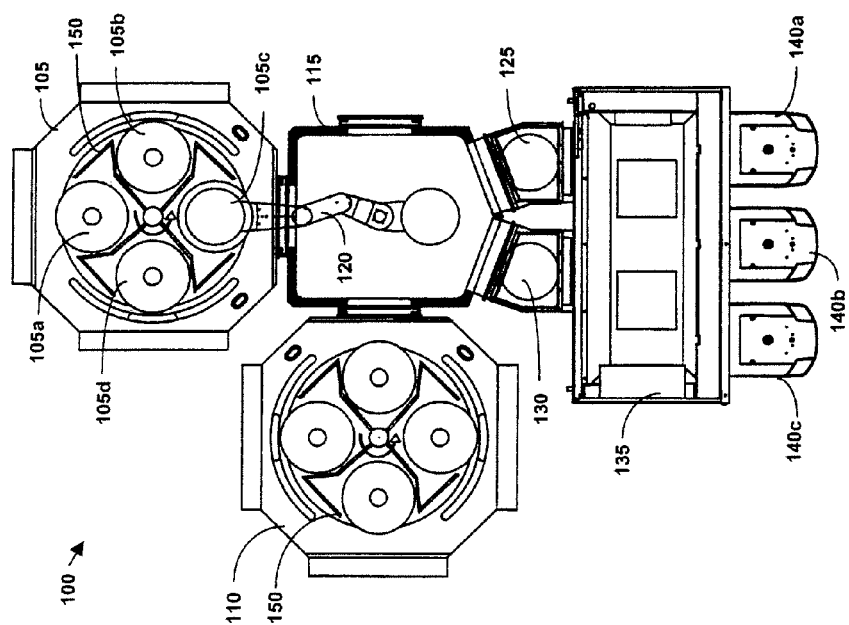
FIG. 1 illustrates a system having two chambers according to an embodiment of the present invention.

FIG. 1 illustrates a system 100 having two chambers, 108 and 110, according to an embodiment of the present invention. In this embodiment, the system 100 is used for chemical vapor deposition on semiconductor substrates. While only two chambers are shown in this example, this particular embodiment may accommodate up to three chambers and other arrangements can be made to accommodate more than three chambers. Each chamber 108 and 110 has four processing stations, 108a-108d and 110a-110d. A central transfer chamber 115 houses at least a robot arm 120, which transfers the wafers to and from each process station. An indexing arm 150 rotates for loading and unloading of wafers by the robot arm 120, as shown by the arrows. The robot arm 120 receives and transfers the substrates via conventional loadlocks 125 and 130, that lead to the conventional mini-environment 135. At the mini-environment 135 the substrates are loaded to and unloaded from the standard cassettes or foups 140a-140c.

As can be understood, each of the chambers 108, 110 and the transfer station 115 has a cover, which is not shown in this illustration so as to show the details of each of these elements. The cover of the transfer station 115 is conventional and, therefore, will not be discussed or shown. However, the cover of the process chambers 108 and 110 is unique and will be shown and explained below with respect to its construction relating to each process station.

Figure 2:
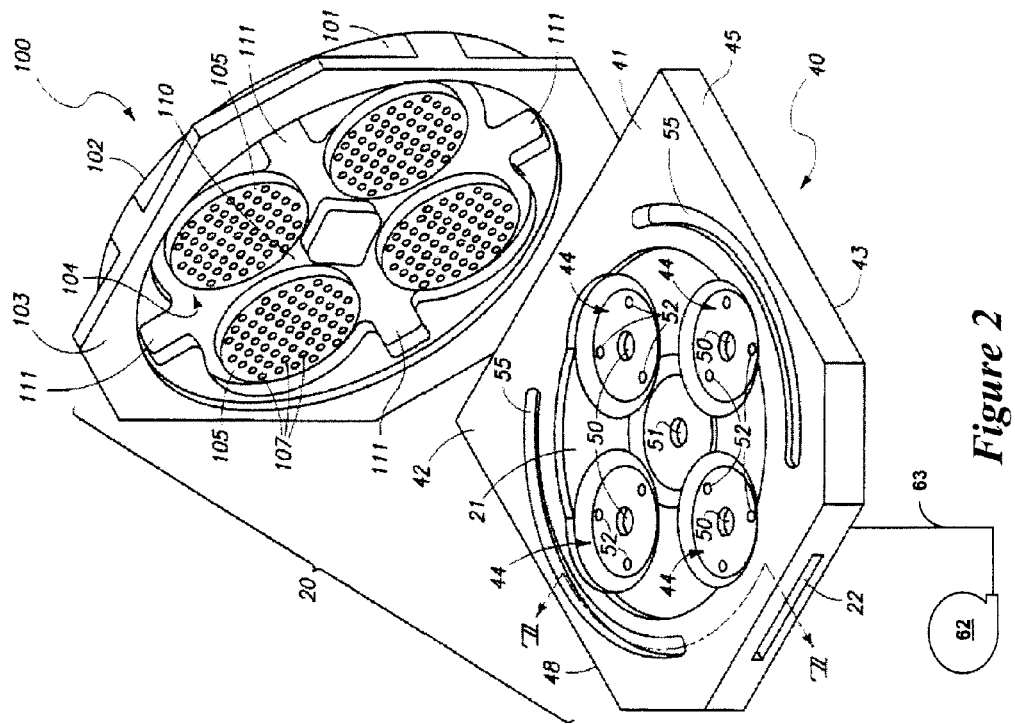
FIG. 2 is a perspective, fragmentary view of the processing chamber of the processing system according to an embodiment of the present invention, and showing the chamber lid in an open position.

Referring now to FIG. 2, a processing chamber 20 according to an embodiment of the present invention is illustrated with its lid 10 in the open position. The chamber 20 includes a chamber base 40, which is defined, at least in part, by a main body 41. The main body has a top surface 42, and an opposite bottom surface 43. A plurality of processing stations 44 are defined in the top surface and are operable to process individual substrates, e.g., semiconductor wafers in the manner which will be described in greater detail, hereinafter. Still further, it should be understood that the main body 41 has a peripheral edge 45 which may assume various shapes having multiple bevels. In the arrangement as seen in FIG. 1, it will be appreciated that three processing chambers 20 can be positioned about the generally pentagonal shaped transfer chamber 23. However, it should be understood that, in other forms of the invention, the transfer chamber 23 can have other shapes such as a hexagonal shape which will allow four semiconductor processing chambers 20 to be positioned about same.

The chamber base 40 has a plurality of shaft holes 50 for receiving the shaft 312 (FIG. 3A) of substrate holder 315 and which is located substantially centrally to each of the processing stations 44. Surrounding each of the shaft holes 50 are individual lift pin shaft holes 52 which will accommodate lift pins which work in combination with the pedestals, or substrate holders 315. An arcuately shaped exhaust passageway 55 is formed in the base 40 and is operable to allow for the passage of reaction gases which are exiting the internal cavity 21 of the processing chamber 20, following the processing of the substrates. The exhaust passageways 55 are coupled to conduits (schematically shown as 63), which lead to a vacuum pump 62. It should be noted that while FIG. 2 illustrates specific evacuation manifold structure, other pumping arrangements might be used. For example, in the processing station of FIG. 3A, the pumping is provided from the bottom of the processing station, under each substrate holder. Thus, for the purpose of this invention any pumping arrangement tailored to substrate processing would be acceptable. However, a feature of this and other embodiments described herein is that a single vacuum pump is used to evacuate all process stations within one processing chamber. This presents a uniform processing pressure within each processing station, so that the same process can be performed simultaneously in all process stations—a feature referred to herein as mini-batch processing.

The processing chamber 20 hingedly cooperates with a processing chamber lid which is generally indicated by the numeral 100. The processing chamber lid 10 has a main body 101 with a top or outside facing surface 102, and an opposite, bottom or inside facing surface 103. As seen in the drawings, the bottom or inside facing surface defines a cavity 104, and a plurality of showerhead assemblies 105 are mounted within the cavity 104. The construction of the showerhead assemblies and elements mounted above will be described below in relation to the particulars of individual processing stations 44. When the processing chamber lid 10 is disposed in the closed position it provides a substantially airtight seal, thereby forming individual processing stations, as will be described further below. It should be understood that the individual showerhead assemblies 105 are substantially coaxially aligned relative to the individual processing station 44. It should also be understood that the showerhead assemblies 105 each define a plurality of small apertures 107 which allow the source of reaction gas to escape into the individual processing stations 44.

Figure 3A:
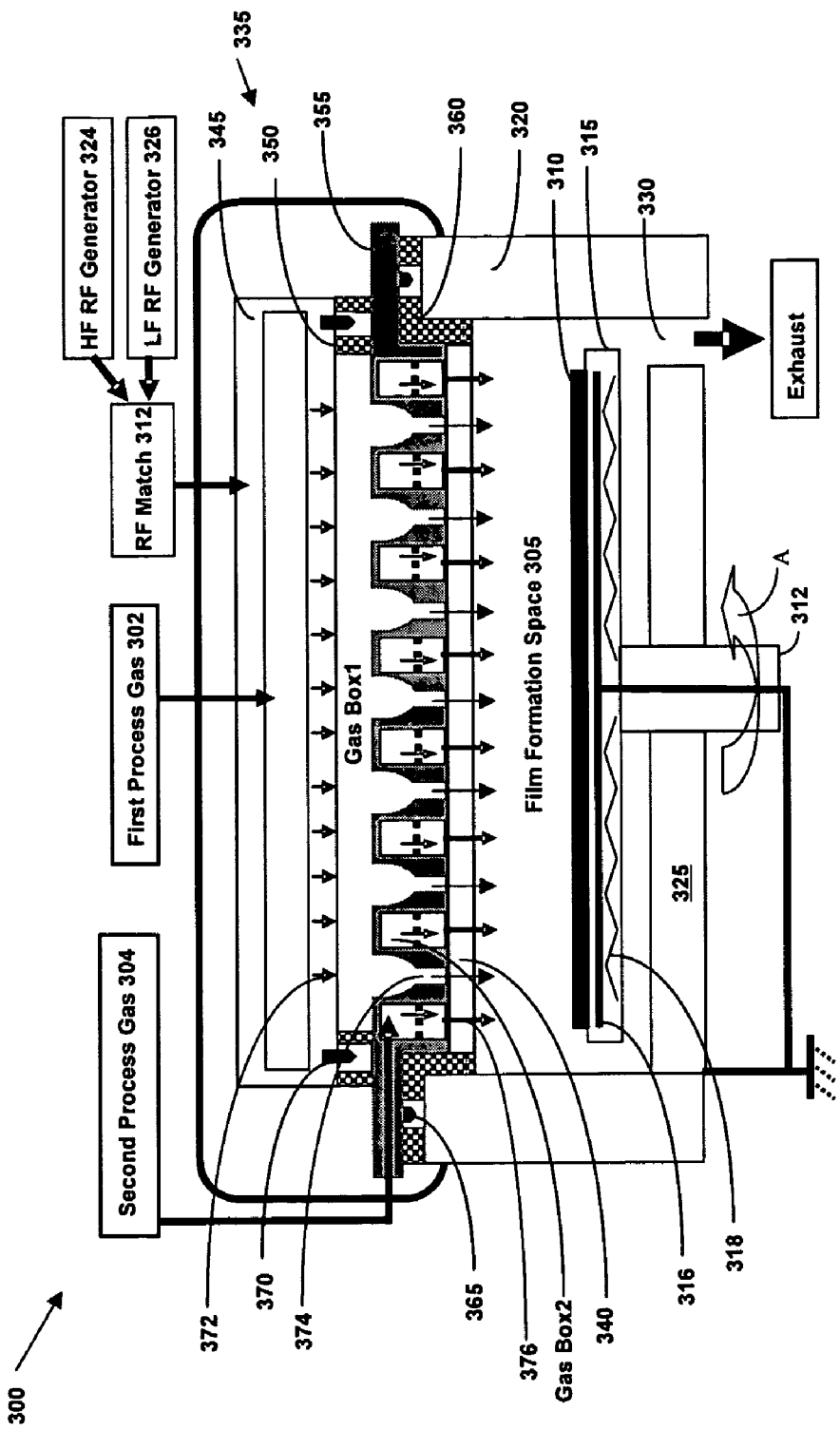
FIG. 3A illustrates the construction of one processing station according to an embodiment of the invention.

FIG. 3A illustrates the construction of one processing station 300 according to an embodiment of the invention. This processing station can be implemented as a single-substrate processing chamber or as one station in a batch system shown in FIGS. 1 and 2. In FIG. 3A, the processing station 300 is formed by a chamber wall 320, a floor 325, having an opening 330 that leads to a vacuum pump, and a top assembly 335. The top assembly 335, corresponding to the showerhead assembly 105 shown in FIG. 2, includes a conductive container 345, a conductive block plate 355, and a conductive showerhead plate 340, all insulated from each other and from the chamber wall 320. The conductive container 345 generally functions as a first or upper showerhead that delivers processing gas into the area marked gas box 1, which is a quasi-remote plasma generation section. The block plate 355 and showerhead plate 340 together function as a second or lower showerhead that has dual function: it delivers processing gas to the film formation space 305 and delivers plasma species and radicals from gas box 1 into the film formation space 305. Consequently, the showerhead assembly 105 is generally made of two showerheads, one showerhead delivering first process gases into a quasi-remote plasma generation region and a second showerhead delivering second processes gases and plasma species from the quasi-remote plasma region into the in-situ plasma region. Hereinafter the first showerhead will be referred to as conductive container 345, while the second showerhead will be referred to by its constituents in the various embodiments, e.g., block plate 355 and shower plate 340. However, it should be noted that the block plate 355 and shower plate 340 may be constructed as a single piece. The quasi-remote plasma region is also referred to as gas box 1, while the in-situ plasma generation region is also referred to as film formation space 305.

The film formation space 305 is defined by the chamber wall 320, floor 325 and the showerhead plate 340, and is where the substrate 310 is positioned. The substrate 310 is positioned on a substrate holder 315, which, in this embodiment, is rotatable, as shown by the arrow A. Notably, in the various embodiments described herein, a rotatable substrate holder is used to provide at least two significant benefits. First, the rotation of the substrate holders enables enhanced film uniformity. Film uniformity is of high importance for modern semiconductor processing. Second, the rotation of the substrate assists in generating uniform pumping. This is especially significant for embodiments where several stations are used in one chamber, and wherein a single pump is used to vacuum all the stations.

A grounded electrode 316 is embedded in the substrate holder 315. In this embodiment two RF generators, high frequency RF generator 324 and low frequency RF generator 326, are coupled to an RF match 312, which couples the RF energy to the conductive container 345. The high RF frequency generator may operate at, e.g., 27 MHz, 40 MHz, 60 MHz, etc., while the low RF frequency generator may operate at the KHz range or at low MHz range, e.g., 2 MHz, 13.56 MHz, etc. A first processing gas or combination of gases from gas supply 302 is injected into gas box 1 380, while a second processing gas or combination of gases from gas supply 304 is injected into gas box 2 375. As can be understood from FIG. 3A, in this embodiment the first and second process gases do not mix until they both reach the film formation space 305.

The chamber illustrated in FIG. 3A may be operated in two different modes: quasi-remote plasma and in-situ plasma. In this embodiment, the switching between the two modes is done via mechanical elements, as follows. A first movable contact 370 may assume one of two positions, in the up/disengaged position the conductive container 345 is electrically insulated, by insulator 350, from the conductive block plate 355; conversely, in the down/engaged position the conductive container 345 is electrically connected to the conductive block plate 355. A second movable contact 365 may assume one of two positions, in the up/disengaged position, the conductive block plate 355 is electrically insulated, by insulation 360, from the grounded chamber wall 320; conversely, in the down/engaged position the conductive block plate 355 is electrically connected to the grounded chamber wall 320.

With further reference to FIG. 3A, when the first movable contact 370 and the second movable contact 365 are both in the up/disengaged position, the conductive container 345 assumes the potential applied by the RF match, while the conductive block plate may be floating. When the first movable contact 370 is in the up/disengaged position and the second movable contact 365 is in the down/engaged position, the conductive container 345 assumes the potential applied by the RF match, while the conductive block plate is grounded. When the first movable contact 370 is in the down/engaged position and the second movable contact 365 is in the up/disengaged position, the conductive container 345 together with the block plate 355 assume the potential applied by the RF match.

Figure 3B:
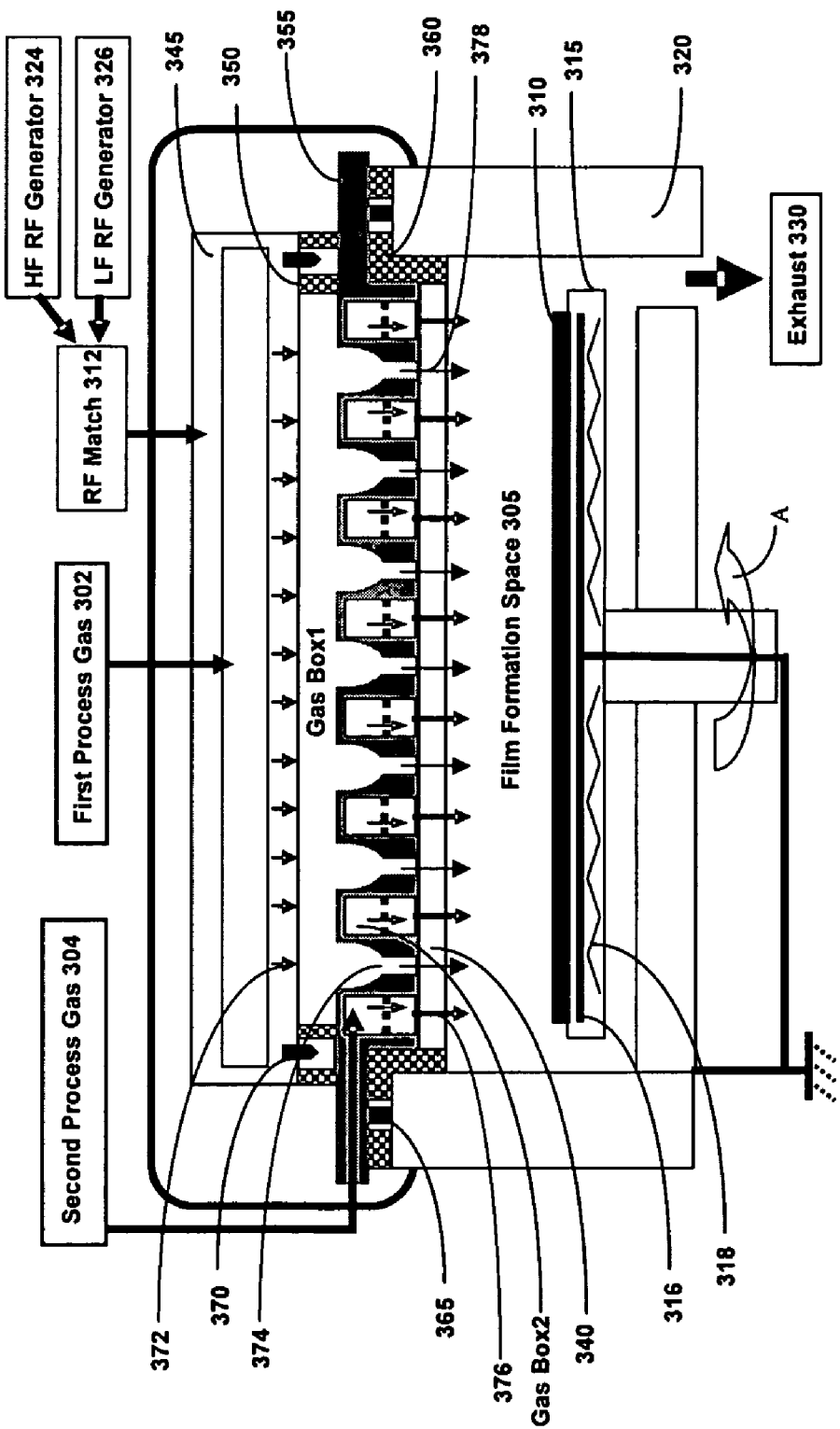
FIG. 3B illustrates the chamber of FIG. 3A operating in the quasi-remote plasma generation mode.

FIG. 3B illustrates the chamber of FIG. 3A operating in the quasi-remote plasma generation mode. In FIG. 3B the movable contact 370 is shown in the up/disengage position, while the movable contact 365 is in the down/engaged position. The first process gas or a mixture of gases 304 are supplied into the conductive container 345, and then distributed into gas box 1 through penetration holes 372 at the bottom plate of the conductive container 345. The high RF frequency or a mixture of the high and low RF frequencies are applied to the conductive container 345, which functions as an electrode to generate plasma discharge in the gas box 1. Consequently, radicals, ions, and species are formed in the gas box 1. Neutral radicals and gas species are then distributed into the film formation space 305 through the penetration holes 374 of the block plate 355 and matching holes on the shower plate 340. The second process gas 304 is supplied into the inner space of the block plate, i.e., gas box 2, and distributed to the film formation space 305 through the penetration holes at the shower plate 340. Radical and species formed by plasma excitation of the first process gas in the gas box 1, and the second process gases are mixed in the film formation space 305, then form film on the substrate 310 through chemical reactions and polymerization, or perform reactor clean through chemical reactions. Notably, for reactor clean operation there may not be necessary to supply the second process gas.

Figure 3C:
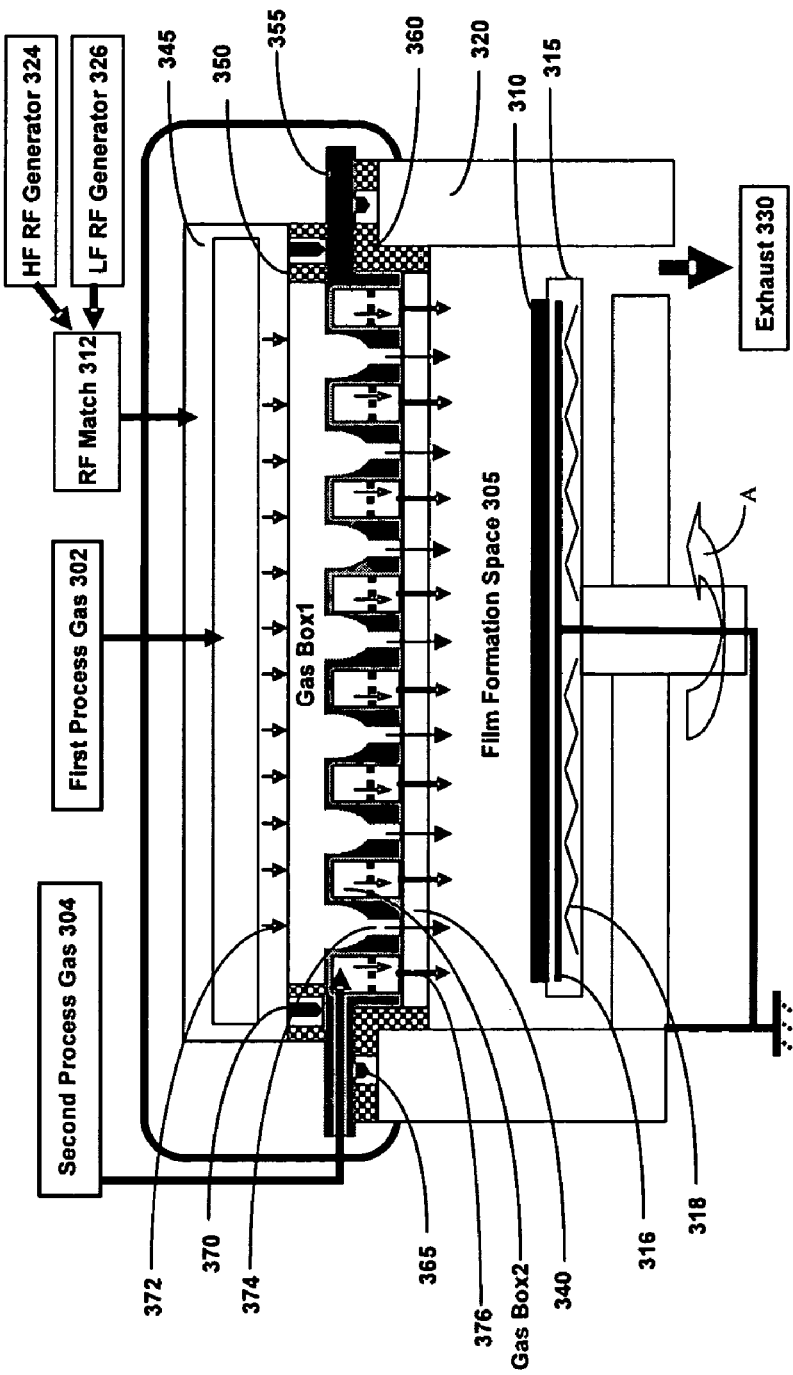
FIG. 3C illustrates the chamber of FIG. 3A operating in the in-situ or direct plasma generation mode.

FIG. 3C illustrates the chamber of FIG. 3A operating in the in-situ or direct plasma generation mode. In FIG. 3C the movable contact 370 is shown in the down/engage position, while the movable contact 365 is in the up/disengaged position. In this condition, the container 345 and the block plate 355 are at the same electrical potential. The high RF frequency or a mixture of the high and low RF frequencies are applied to the conductive container 345, and thereby to the conductive block plate 355. The conductive block plate 355, together with the showerhead 340, then function as an electrode to generate plasma discharge in the film formation space 305. The first process gas 304 is supplied into the conductive container 345, and then distributed into gas box 1 through penetration holes 372 at the bottom plate of the conductive container 345, and from there proceed to the film formation space 305 via holes 374. The second process gas 304 is supplied into the inner space of the block plate, i.e., gas box 2, and distributed to the film formation space 305 through the penetration holes at the shower plate 340. As plasma is ignited in film formation space 305, radicals, ions, and species are present in the film formation space 305. Radical and species formed by plasma excitation of the first and/or second process gas in the film formation space 305 then form film on the substrate 310 through chemical reactions and polymerization.

The apparatus of FIG. 3A may also be used for thermal CVD film formation. For this operation, the conductive container 345 and block plate 355 are electrically separated by keeping the first movable contact 370 at the up/disengaged position. The block plate 355 is disconnected from the reactor body 320 by keeping the second movable contact 365 at the up/disengaged position. The substrate 310 is held by the holder 315 and is heated by a heater 318 embedded in the holder 315. The first process gas 302 is supplied into the conductive container 345, and then distributed into gas box 1 through penetration holes 372 at the bottom plate of the conductive container, and then finally distributed into the film formation space 305 through the penetration holes 374 at the block plate 355 and shower plate 340. The second process gas 304 is supplied into the inner space of the block plate, i.e., gas box 2, and distributed to the film formation space through the penetration holes at the shower plate 340. The first and the second process gases are then mixed in the film formation space 305, and then form film on the substrate 310 through chemical reactions using thermal energy as reaction energy.

As can be understood from the above description and related drawings, the vacuum reactor of FIGS. 3A-3C consists of three compartments. The first compartment is formed by the conductive container 345, the first insulation ring 350, and the conductive block plate 355. This compartment is utilized for the introduction and distribution of the first process gases 302, and is called gas box 1. The second compartment is formed by the above conductive block plate 355 and a conductive shower plate 340 for the introduction and distribution of the second process gases, and is called gas box 2. The third compartment is formed by the above conductive shower plate 340, the second insulation ring 360, and the conductive reactor body 320, and is called film formation space 305. The third compartment contains the substrate holding mechanism 315 for mounting substrate 310.

The conductive container 345 is connected to a high frequency and a low frequency RF power suppliers 324 and 326, and the bottom plate of the container 345 has penetration holes 372 for the first process gases distribution from the container to the gas box 1. In this respect, it should be appreciated that whenever a process gas is referred to here, it may mean a single gas specie or a mixture of several gases. The first insulation ring 350 is disposed between the conductive container 345 and the conductive block plate 355, thus the conductive container 345 and conductive block plate 355 are electrically isolated from each other by the first insulation ring 350 whenever the first movable contact is in the up/disengage position.

The conductive block plate 355 has penetration holes 374 for the first process gases distribution from the gas box 1 to the film formation space 305. The block plate 355 also has an inner space separated from the gas box 1, and communicating with the film formation space through the holes 376 opened in the shower plate 340 for the second process gases introduction and distribution into the film formation space 305. The conductive shower plate 340 is electrically connected to the conductive block plate 355 and together form the gas box 2. The shower plate 340 has two groups of penetration holes, 374, 376, for the communication of gas box 1 to film formation space 305, and gas box 2 to film formation space 305, respectively.

The second insulation ring 360 is disposed between the conductive block plate 355 and conductive reactor body 320, thus the conductive block plate 355 and conductive reactor body 320 are electrically isolated from each other whenever the second movable contact 365 is in the up/disengaged position. The conductive reactor body 320 and the electrode 316 of the substrate holding mechanism 315 are grounded.

Figure 4A:
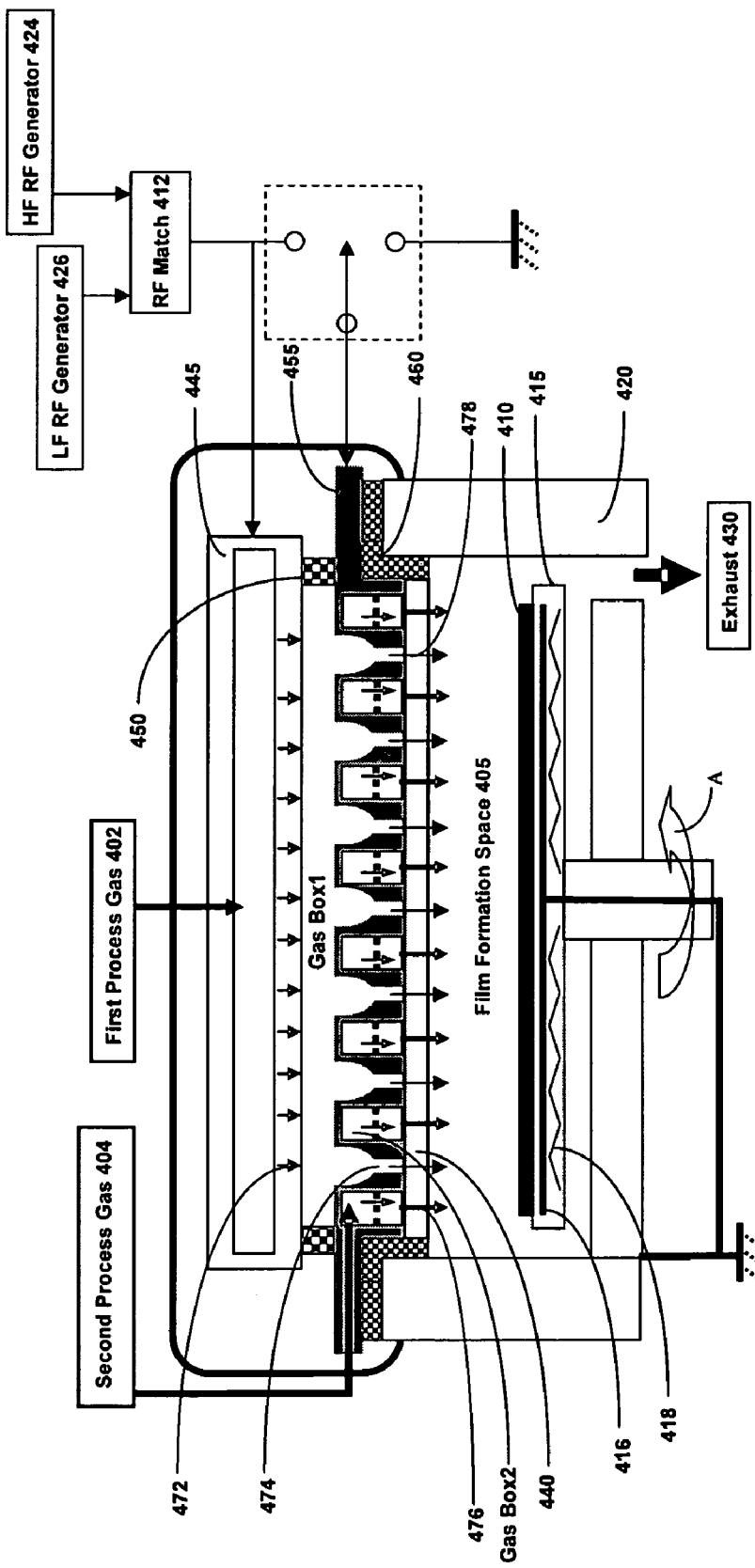
FIG. 4A illustrates the construction of another processing station according to an embodiment of the invention.

FIG. 4A illustrates another embodiment of a processing chamber 400 that may be implemented in the system shown in FIG. 1. All of the elements that are similar to the embodiment of FIG. 3A are marked with the same reference number, except that they are in the 4xx series. These elements will not be described again. In this embodiment, no mechanically movable contacts are used to bias the container 445 and/or the block plate 455. Instead, the switching is done electrically by switch 480, which may be located remotely from the process station 400. Alternatively, the switch 480 may be incorporated into the RF match 412. Specifically, the switch may be constructed as mechanical device, electrical device, or implemented in hardware, software, or combination of hardware and software. In the embodiment of FIG. 4A the container 445 is directly connected to the RF match 412, while the electrical connection to the block plate 455 is controlled by switch 480. Consequently, in this embodiment the container 445 is always biased by the RF match, while the block plate 455 may assume one of three positions: biased by the RF match, floating, or grounded. In the illustration of FIG. 4A the block plate 455 is floating.

Figure 4B:
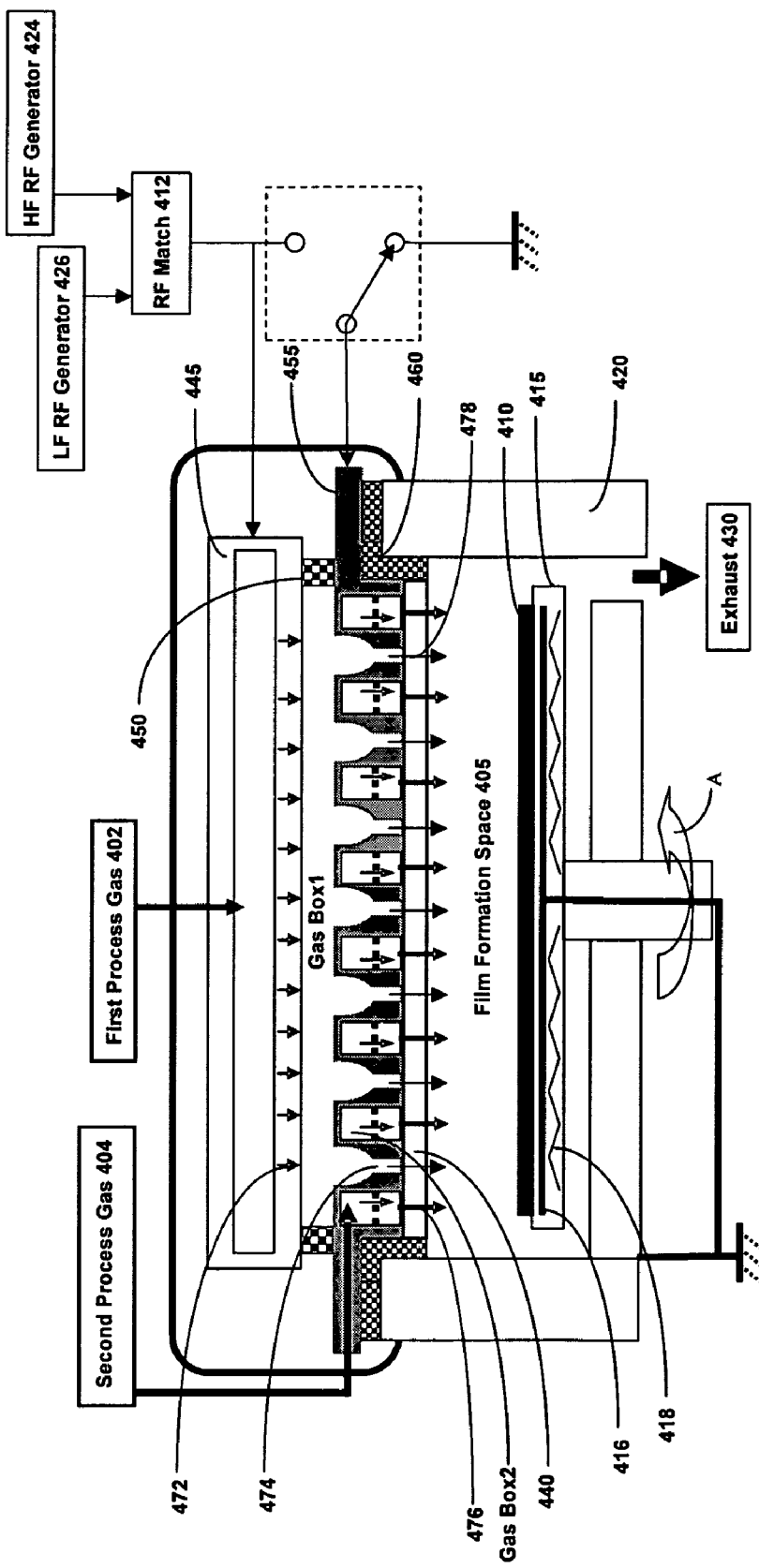
FIG. 4B illustrates the chamber of FIG. 4A operating in the quasi-remote plasma generation mode.

In FIG. 4B, the switch 480 has been activated to connect the block plate 455 to ground. A high frequency electric power or a mixture of a high frequency electric power and a low frequency electric power is applied to the conductive container 445 to generate plasma discharge in the gas box 1, and thereby form radicals, ions, and plasma species in the gas box 1. Neutral radicals and gas species are distributed into the film formation space through the injection holes 474 of the block plate 445 and holes 478 of shower plate 440. The second process gases may be supplied into the inner space of the block plate, i.e., gas box 2, and distributed to the film formation space 405 through the injection holes 476 at the shower plate 440. Radical and species formed by plasma excitation of the first process gases in the gas box 1, and the second process gases are mixed in the film formation space 405, then form film on the substrate through chemical reactions and polymerization, or perform reactor clean through chemical reactions.

Figure 4C:
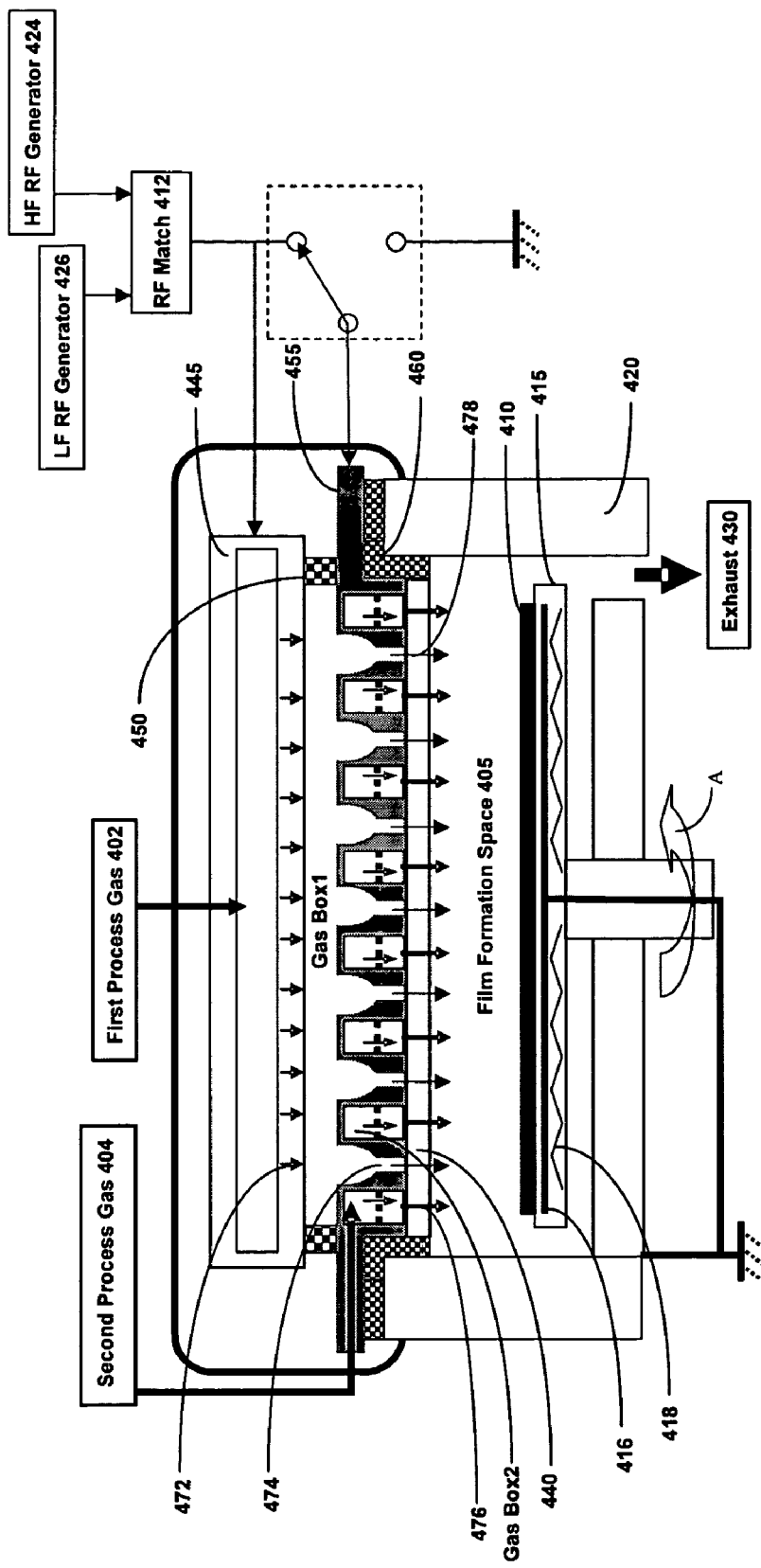
FIG. 4C illustrates the chamber of FIG. 4A operating in the in-situ or direct plasma generation mode.

In FIG. 4C, the switch 480 has been activated to connect the conductive block plate 455 and the conductive container 445 together. A high frequency electric power or a mixture of a high frequency electric power and a low frequency electric power is applied to the conductive container 445 and block plate 455. Under such an arrangement the conductive shower plate 440 is used as an electrode because of isoelectric potential between the conductive container 445, block plate 455, and shower plate 440. Plasma discharge is generated in the film formation space 405 between the shower plate 440 and substrate holding mechanism 415. The first and the second process gases are mixed in the film formation space 405, then form film on the substrate through chemical reactions and plasma polymerization, or perform plasma treatment or reactor clean by ion, radical, and species through chemical reactions.

Figure 5A:
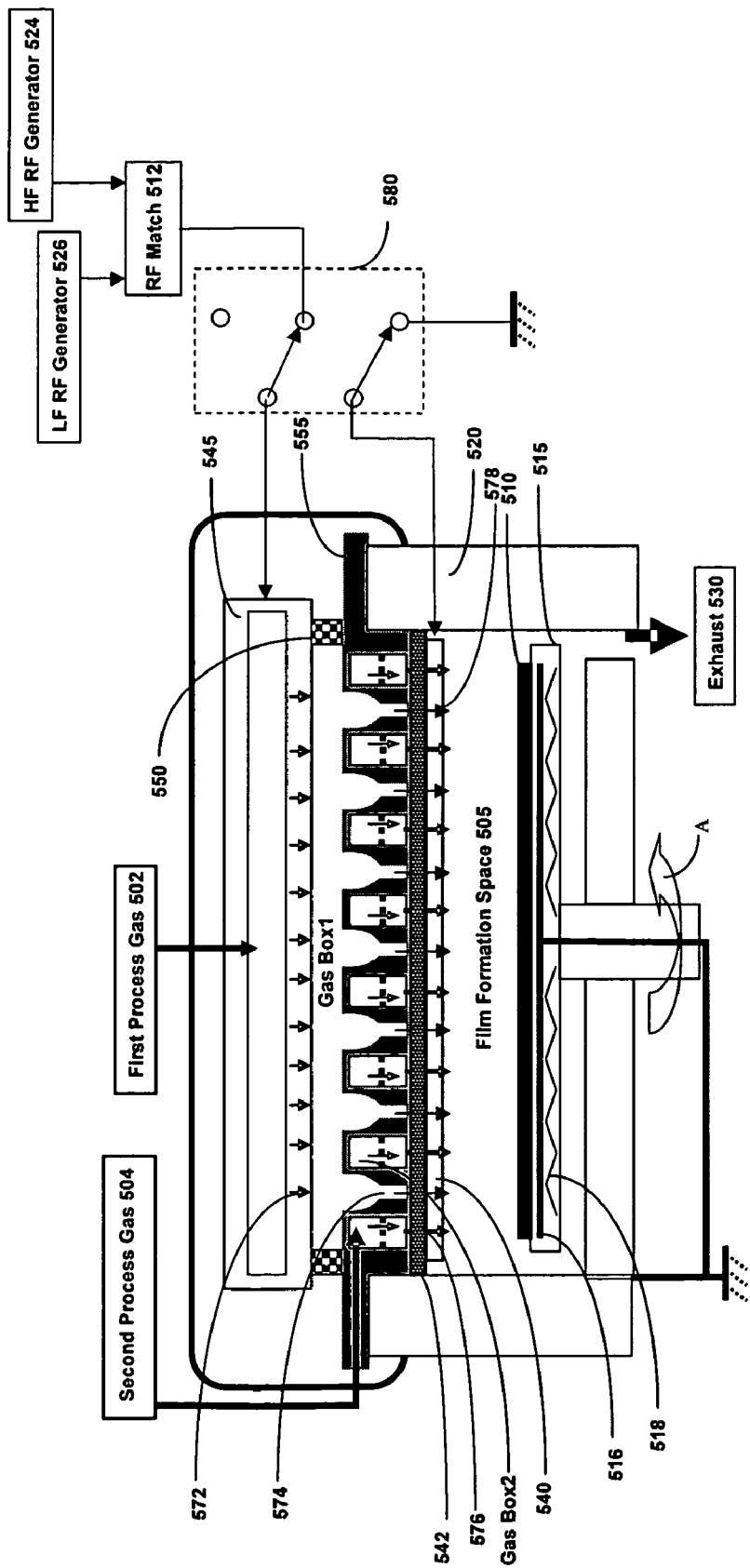
FIGS. 5A and 5B illustrate the construction of yet another processing station according to an embodiment of the invention.
Figure 5B:
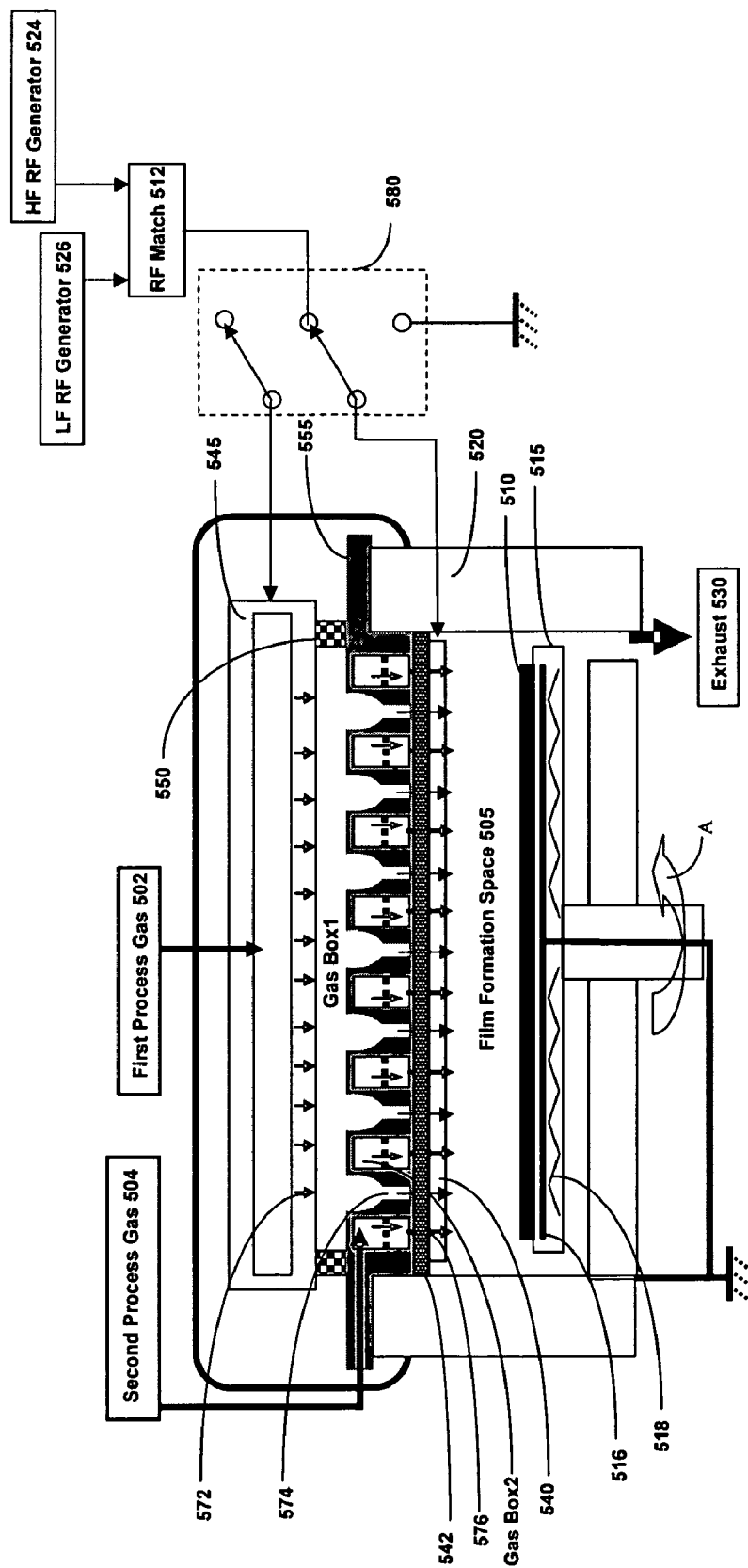

FIGS. 5A and 5B illustrate the construction of yet another processing station according to an embodiment of the invention. All of the elements that are similar to the embodiment of FIG. 3A are marked with the same reference number, except that they are in the 5xx series. These elements will not be described again.

The CVD vacuum reactor of FIGS. 5A and 5B consists of three compartments. The first compartment is formed by a conductive container 545, an insulation material ring 550, and a conductive block plate 555, which is utilized for the first process gases introduction and distribution, and called gas box 1. The second compartment is formed by the above conductive block plate 555 and an insulation plate 542, which is utilized for the second process gases introduction and distribution, and called gas box 2. The third compartment is formed by the conductive shower plate 540 and the conductive reactor body 520, which is utilized for film formation, and called film formation space 505.

The switch 580 enables coupling the conductive container 545 to the RF match 512 or to floating potential. The switch 580 also enables coupling the conductive showerhead 540 to the RF match 512 or to ground. FIG. 5A illustrate the condition where the switch 580 is selected so that the container 545 is coupled to the RF match 512, while the conductive showerhead 540 is grounded. This condition is selected for quasi-remote plasma operation. FIG. 5B illustrate the condition where the switch 580 is selected so that the container 545 is floating, while the conductive showerhead 540 is coupled to the RF match 512. This condition is selected for in-situ plasma formation.

In the embodiments of FIGS. 5A and 5B the insulation ring 550 is disposed between the conductive container 545 and conductive block plate 555, thus the conductive container 545 and conductive block plate 555 are electrically insulated from each other. Also, the insulation plate 542 is disposed between the block plate 555 and conductive shower plate 540, so that the shower plate 540 is insulated from the block plate 555 and the chamber body 520.

FIG. 5A illustrates the condition of the process station when the switch 580 is positioned for quasi-remote plasma operation. In this position, the container 545 is coupled to the RF match 512, while the showerhead plate 540 is coupled to ground. The first process gases are supplied into the conductive container 545, and then distributed into gas box 1 through penetration holes 572 at the bottom plate of the conductive container 545. An RF electric power from RF match 512 is applied to the conductive container 545 as an electrode to generate plasma discharge in the gas box 1 (i.e., remote plasma). Consequently, radicals, ions, and plasma species are formed in the gas box 1. Neutral radicals and gas species are distributed into the film formation space through the penetration holes 574 and 578 at the block plate 555 and shower plate 540. If required, the second process gases are supplied into the inner space of the block plate 545, i.e., gas box 2, and distributed to the film formation space through the penetration holes 576 at the shower plate 540. Radical and species formed by plasma excitation of the first process gases in the gas box 1, and the second process gases are mixed in the film formation space 505.

FIG. 5B illustrates the condition of the process station when the switch 580 is positioned for in-situ plasma operation. In this position, the container 545 is coupled to a floating potential, while the showerhead plate 540 is coupled to the RF match 512. The gases are supplied as in the embodiment of FIG. 5A. An RF electric power from RF match 512 is applied to the conductive shower plate 540 as an electrode to generate plasma discharge in the film formation space 505 (i.e., direct or in-situ plasma). A film is formed on the substrate through chemical reactions and polymerization.

Figure 5C:
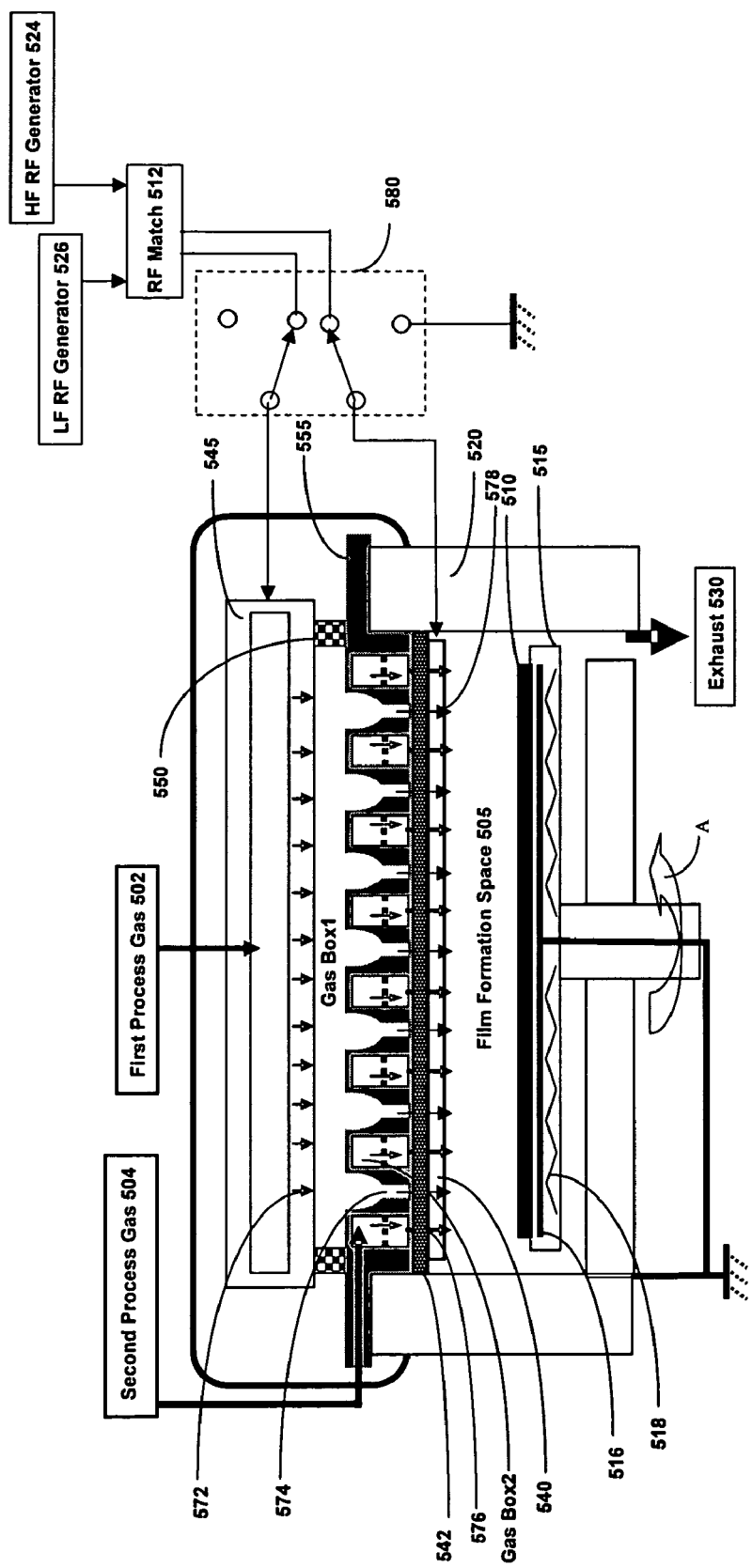
FIG. 5C illustrates a variation of the process station of FIGS. 5A and 5B.

FIG. 5C illustrates a variation of the process station of FIGS. 5A and 5B. In the embodiment illustrated in FIG. 5C, the process station may be operated in quasi-remote or in-situ plasma as illustrated in FIGS. 5A and 5B, but may also be operated in quasi-remote and in-situ plasma simultaneously. As shown in FIG. 5C the switch 580 enables coupling the container 545 to either floating potential or RF match 512, and enables coupling the shower plate 540 to either RF match 512 or ground. Also, in FIG. 5C the switch 580 enables providing different frequency to the container 545 and shower plate 540. For example, for concurrent quasi-remote and in-situ plasma generation the switch is operated to couple the container 545 to either the low or high RF frequency generator, and couple the shower plate 540 to the other RF generator. In such condition, plasma is generated in both gas box 1 and in the film formation space 505. In this condition, neutral radicals and gas species generated by the plasma in gas box 1 are distributed into the film formation space 505 through the penetration holes 574 and 578 at the block plate 555 and shower plate 540. They then enter the plasma generated in film formation space 505 and mix with the second process gases.

In should be appreciated that in the embodiments of FIGS. 5A-5C, when no RF power is applied to the container 545, block plate 555, or showerhead 540, thermal processing may be performed without generation of plasma. For example, in the embodiment of FIG. 5C the container may be coupled to the floating potential, while the showerhead plate 540 may be coupled to ground. Then, the heater 518 may be energized for thermal processing. Also, the heater 518 may be energized to assist in processing or cleaning using any of the above embodiments in any RF energizing configuration.

Figure 5D:
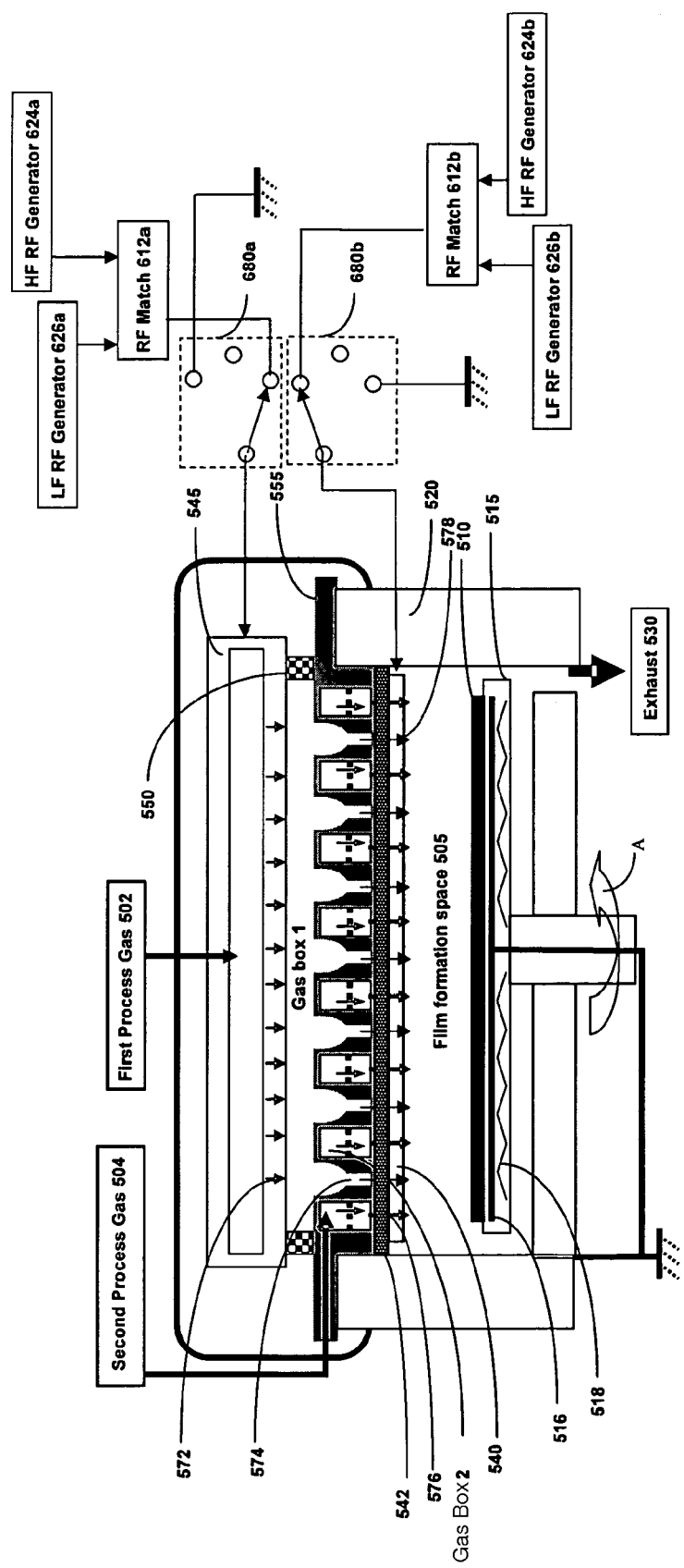
FIG. 5D illustrates another variation of the process station of FIGS. 5A and 5B.

FIG. 5D illustrates another variation of the process station of FIGS. 5A and 5B. In the embodiment illustrated in FIG. 5D, the process station may be operated in quasi-remote or in-situ plasma as illustrated in FIGS. 5A and 5B, but may also be operated in quasi-remote and in-situ plasma simultaneously. As shown in FIG. 5D a first switch 680a enables selectively coupling the first or upper showerhead 545 to floating potential, ground or RF match 612a. A second switch 680b enables selectively coupling the second or lower showerhead 540 to floating potential, ground or RF match 612b. The RF match 612a can be selectively coupled to the container 545 either by mechanical switching or software control. The RF match 612b can be selectively coupled to the second showerhead either by mechanical switching or software control.

The following is an example of a method for producing a silicon nitride film using any of the above described process stations. While this process example may be operated in a single chamber having a single process station, here a mini-batch process is performed. That is, a chamber having four process stations, each structured according to one of the embodiments described above, is used. Four substrates are loaded, each into one process station. Then, process is commenced for simultaneously forming silicon nitride on all four substrates concurrently. That is, the same steps are performed so as to have the same process condition in each of the process station.

First, all of the process stations are operated to assume the quasi-remote plasma generation mode. For example, the conductive container and block plate are isolated from each other, while the container is coupled to RF energy. The block plate is grounded, e.g., by connecting it to the reactor body, such as by moving the second movable contact down to contact with the reactor body.

The first process gases group consists of three kinds of gases. The first kind of gases comprises at least one of the following gases: ammonia, hydrazine, nitrogen, and hydrogen. The second kind of gases comprises at least one of the following gases: argon, helium, and xenon. The third kind of gases comprises one or more hydrocarbon compounds which have the general formula CxHy, and x has a range of 2 to 4 and y has a range of 2 to 10, e.g., acetelyne ($C_2H_2$), ethylene ($C_2H_4$), and ethane ($C_2H_6$). The first process gases group is supplied into the conductive container, and then distributed into gas box 1 through penetration holes at the bottom plate of the conductive container. A high frequency electric power or a mixture of a high frequency electric power and a low frequency electric power is applied to the conductive container as an electrode to generate plasma discharge in the gas box 1, and radicals, ions, and species are formed in the gas box 1. Neutral radicals and gas species are distributed into the film formation space through the penetration holes at the block plate and shower plate from gas box 1.

The second process gases group consists of two kinds of gases. The first kind of gases comprises at least one of the following three compounds. The first compound comprises Si and H in any combination. The second compound comprises Si, N and H in any combination. The third compound comprises Si, N, C and H in any combination. The second kind of gases comprises at least one of the following gases: ammonia, hydrazine, nitrogen, hydrogen, argon, helium, and xenon. The above compound comprising Si and H has the general formula $Si_xH_y$, and x has a range of 1 to 2 and y has a range of 4 to 6, e.g, $SiH_4$, $Si_2H_6$. The second compound comprising Si, N and H has the general formula $(SiH_3)_{3-n}NH_n$, and n has a range of 0 to 2, e.g., TriSilylAmine (TSA, $(SiH_3)_3N$). The third compound comprising Si, N, C and H has the general formula $(R—NH)_{4-n}SiX_n$, wherein R an alkyl group (which may be the same or different), X is H or halogen, and n has a range of 0 to 3, e.g, Bis(TertiaryButylAmino)Silane (BTBAS, $(t-C_4H_9NH)_2SiH_2$), Tetrakis(DiethylAmino)Silane (TDAS, $Si(N(C_2H_5)_2)_4$. The above three kinds of compounds may be liquid. Liquid compounds are vaporized to gas for CVD use.

The second process gases group is supplied into the inner space of the block plate, i.e., gas box 2, and distributed to the film formation space through the penetration holes at the shower plate. Radical and species formed by plasma excitation of the first process gases group in the gas box 1, and the second process gases group are mixed in the film formation space, then form silicon nitride film on the substrate through chemical reactions and polymerization, and the film comprises carbon from 1% to 20% by atomic weight.

As can be understood from the above, the in-situ plasma mode may be used for film deposition, substrate surface treatment, post deposition film surface treatment, and chamber dry clean. The quasi-remote plasma mode can be used for film deposition and for chamber dry clean. The following examples show processing sequences that may be implemented using the innovative chamber. Quasi-remote plasma is ignited and film is deposited on the substrate. Then, the substrate is removed and the quasi-remote plasma is used for dry cleaning of the chamber. Alternatively, after the substrate is removed the chamber may be cleaned by igniting in-situ plasma. Still alternatively, the film may be deposited using in-situ plasma, while cleaning is performed using quasi-remote plasma. Using other sequences, the surface of the substrate may be first treated using in-situ plasma, then film is deposited on the substrate using quasi-remote plasma. The film deposition may be optionally followed by surface treatment with in-situ plasma, and then the chamber may be cleaned using quasi-remote plasma.

Figure 6:
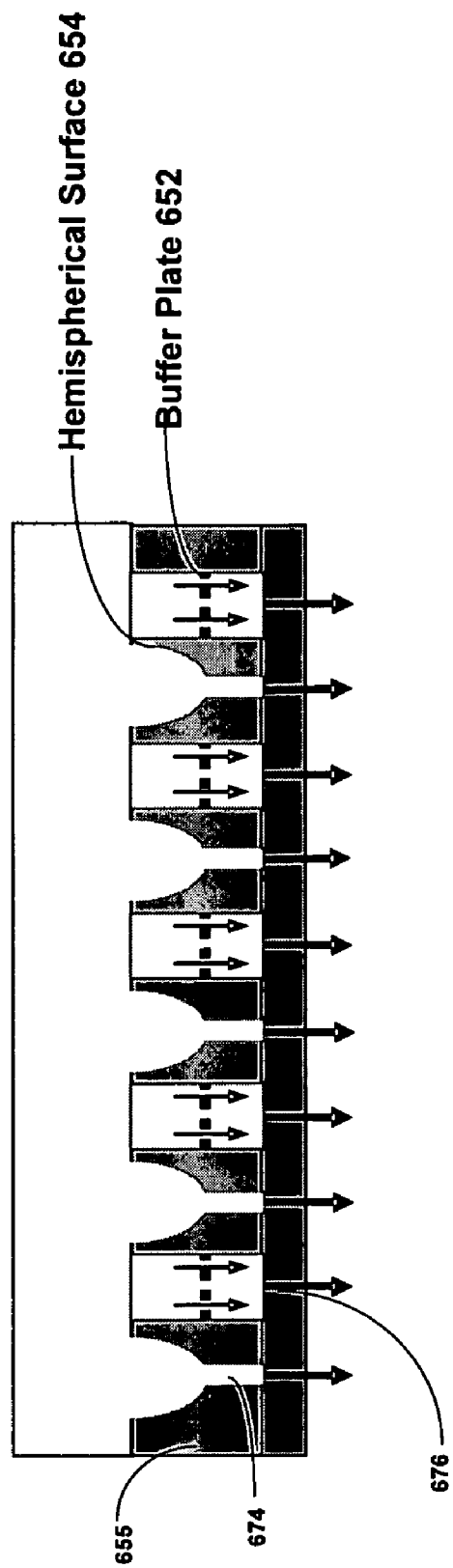
FIG. 6 illustrates an embodiment of the block plate assembly according to an embodiment of the invention.

FIG. 6 illustrates an embodiment of the block plate assembly according to an embodiment of the invention. The top section of the block plate 655 has hemispherical indentations 654, which face the quasi-remote plasma generation region, referred to as gas box 1. The hemispherical indentations lead to injection holes 674, which enable plasma species to drift down towards the film formation space above the substrate (not shown). From the lower part of the block plate 655 sections are provided to form gas box 2. A buffer plate 652 is provided in the inner space of the conductive block plate (i.e., gas box 2) for second process gases uniform distribution. The second process gases are supplied into the gas box 2, and distributed to the film formation space through penetration holes 676 at the bottom of the block plate 654.

The diameter of the hemispherical surfaces 654 at the top section is larger than the diameter of holes 674. The hemispherical surface facing gas box 1 avoids unstable plasma and arcing in the gas box 1, and increases radical density by extending the plasma generation space to the portion towards holes 674.

Finally, it should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein. The present invention has been described in relation to particular examples, which are intended in all respects to be illustrative rather than restrictive. Those skilled in the art will appreciate that many different combinations of hardware, software, and firmware will be suitable for practicing the present invention. For example, the described software may be implemented in a wide variety of programming or scripting languages, such as Assembler, C/C++, perl, shell, PHP, Java, HFSS, CST, EEKO, etc.

The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A plasma chamber, comprising:
   a chamber body defining therein a plurality of process stations;
   a plurality of rotating substrate holders, each situated in one of the process stations;
   a plurality of in-situ plasma generation regions, each plasma generation region provided above one of the substrate holders;
   a plurality of quasi-remote plasma generation regions, each provided above a corresponding in-situ plasma generation region and being in gaseous communication with the corresponding in-situ plasma generation region; and,
   an RF energy source coupled to each of the quasi-remote plasma generation regions.

2. The plasma chamber of claim 1, further comprising a first gas delivery system coupled to the each of the quasi-remote plasma generation regions, and a second gas delivery system coupled to the each of the in-situ plasma generation regions.

3. The plasma chamber of claim 2, wherein the second gas delivery system further delivers gaseous species from each of the quasi-remote plasma generation regions to a corresponding in-situ plasma generation region.

4. The plasma chamber of claim 1, further comprising evacuation manifold coupling all of the process stations to a single vacuum pump.

5. The plasma chamber of claim 1, wherein the RF energy source comprises a high frequency RF generator, a low frequency RF generator, and an RF match.

6. The plasma chamber of claim 1, further comprising a switching mechanism controlling plasma striking in the quasi-remote plasma generation regions and the in-situ plasma generation regions.

7. The plasma chamber of claim 1, further comprising a heater situated within each of the substrate holders.

8. A plasma chamber, comprising:
a chamber body;
a rotating substrate holder situated within the chamber body;
a first showerhead;
a second showerhead spaced apart from the first showerhead and electrically insulted from the first showerhead and from the chamber body, wherein a quasi-remote plasma generation region is defined in between the first and second showerheads and an in-situ plasma generation region is defined between the second showerhead and the substrate holder, the first showerhead delivering first process gas to the quasi-remote plasma generation region and the second showerhead delivering second process gas to the in-situ plasma generation region, the second showerhead further delivering plasma species from the quasi-remote plasma generation region to the in-situ plasma generation region;
an RF source coupled to the first showerhead; and,
a switching mechanism alternatively coupling the second showerhead to the RF source or to ground potential.

9. The plasma chamber of claim 8, wherein the switching mechanism comprises an arrangement of movable mechanical contacts alternatively coupling the second showerhead to the first showerhead or to the chamber body.

10. The plasma chamber of claim 8, wherein the switching mechanism comprises an electrical switch.

11. The plasma chamber of claim 8, wherein the second showerhead comprises a conductive shower plate, an insulation plate coupled to the conductive shower plate, and a conductive block plate coupled to the insulation plate; and,
wherein the block plate is coupled to ground and the switching mechanism alternatively couples the conductive shower plate to the RF source or to ground potential.

12. The plasma chamber of claim 11, wherein the switching mechanism further alternatively couples the first showerhead to the RF source or to floating potential.

13. The plasma chamber of claim 8, wherein the second showerhead comprises a shower plate and a conductive block plate coupled to the shower plate, and wherein the block plate comprises hemispherical holes facing the quasi-remote plasma generation region.

14. The plasma chamber according to claim 13, wherein the second showerhead further comprises a buffer plate for even distribution of the second process gas.

15. The plasma chamber according to claim 8, further comprising a heater situated in the substrate holder.

16. The plasma chamber of claim 8, wherein the RF source comprises a high frequency RF generator, a low frequency RF generator, and an RF match.

17. The plasma chamber of claim 8, wherein the switching mechanism further alternatively couples the second showerhead to float potential.

18. A plasma chamber, comprising:
a chamber body defining therein a plurality of process stations;
a plurality of rotating substrate holders, each situated in one of the process stations;
a plurality of upper showerheads, each upper showerhead provided in corresponding process station;
a plurality of lower showerheads, each lower showerhead provided in a corresponding process region and spaced apart from the upper showerhead and electrically insulted from the upper showerhead and from the chamber body, wherein a quasi-remote plasma generation region is defined in between the upper and lower showerheads in each processing region, and an in-situ plasma generation region is defined between the lower showerhead and the substrate holder in each process region, the upper showerhead delivering first process gas to the quasi-remote plasma generation region and the lower showerhead delivering second process gas to the in-situ plasma generation region, the lower showerhead further delivering plasma species from the quasi-remote plasma generation region to the in-situ plasma generation region;
an RF source coupled to the plurality of upper showerheads; and,
a switching mechanism alternatively coupling the lower showerhead to the RF source or to ground potential.

19. The plasma chamber of claim 18, further comprising evacuation manifold coupling all of the process stations to a single vacuum pump.

20. The plasma chamber of claim 18, wherein the RF energy source comprises a high frequency RF generator, a low frequency RF generator, and an RF match.

21. The plasma chamber of claim 18, wherein the switching mechanism further controls plasma striking in each of the quasi-remote plasma generation regions and each of the in-situ plasma generation regions.

22. The plasma chamber of claim 21, wherein the switching mechanism comprises an arrangement of movable mechanical contacts alternatively coupling each of the lower showerheads to the corresponding upper showerhead or to the chamber body.

23. The plasma chamber of claim 21, wherein the switching mechanism comprises an electrical switch.

24. A plasma chamber, comprising:
a chamber body;
a rotating substrate holder situated within the chamber body;
a first showerhead;
a second showerhead spaced apart from the first showerhead and electrically insulted from the first showerhead and from the chamber body, wherein a quasi-remote plasma generation region is defined in between the first and second showerheads and an in-situ plasma generation region is defined between the second showerhead and the substrate holder, the first showerhead delivering first process gas to the quasi-remote plasma generation region and the second showerhead delivering second process gas to the in-situ plasma generation region, the second showerhead further delivering plasma species from the quasi-remote plasma generation region to the in-situ plasma generation region;
a first RF source selectively coupled to the first showerhead either by mechanical switching or software control; and,
a second RF source selectively coupled to the second showerhead either by mechanical switching or software control.

25. The plasma chamber of claim 18, wherein each of the lower showerheads comprises a conductive shower plate, an insulation plate coupled to the conductive shower plate, and a conductive block plate coupled to the insulation plate; and, wherein the block plate is coupled to ground and the switching mechanism alternatively couples the conductive shower plate to the upper showerhead or to ground potential.

26. The plasma chamber of claim 18, wherein the switching mechanism further alternatively couples the first showerhead to the RF source or to floating potential.

27. The plasma chamber of claim 18, wherein each of the lower showerheads comprises a shower plate and a conductive block plate coupled to the shower plate, and wherein the block plate comprises hemispherical holes facing the quasi-remote plasma generation region.

28. The plasma chamber of claim 18, wherein the switching mechanism further alternatively couples the lower showerhead to float potential.

* * * * *